United States Patent [19]

Taguchi et al.

[11] 4,405,901
[45] Sep. 20, 1983

[54] SIGNAL PROCESSING CIRCUIT
[75] Inventors: Shinichiro Taguchi; Nobuya Nagao; Yutaka Ogihara, all of Fukaya, Japan
[73] Assignee: Tokyo Shibaura Denki Kabushiki Kaisha, Kawasaki, Japan
[21] Appl. No.: 237,111
[22] Filed: Feb. 23, 1981
[51] Int. Cl.³ .............................................. H03F 3/45
[52] U.S. Cl. ..................................... 330/261; 330/302
[58] Field of Search ............... 330/259, 261, 207, 306, 330/302; 358/35

[56] References Cited
U.S. PATENT DOCUMENTS
3,831,117 8/1974 Fletcher et al. ..................... 330/302
4,296,381 10/1981 Hofer ...................................... 330/9

FOREIGN PATENT DOCUMENTS
55-42411 3/1980 Japan ..................................... 330/261

Primary Examiner—James B. Mullins
Assistant Examiner—Gene Wan
Attorney, Agent, or Firm—Cushman, Darby & Cushman

[57] ABSTRACT

An arrangement for coupling an AC input signal having a DC component to a plurality of differential amplifiers without causing a DC off-set. The AC input including a DC component is commonly fed through a compensation resistor to a signal input terminal of each of the differential amplifiers. The DC component contained in the AC input signal is extracted by a low-pass filter including a resistor and a capacitor and is applied to a bias input terminal of each of the differential amplifiers.

6 Claims, 7 Drawing Figures

SIGNAL PROCESSING CIRCUIT

This invention relates to signal processing circuits for processing, for instance, amplifying signals having a DC component, in which a desired DC bias voltage used for amplifying the signal is formed in accordance with the DC component.

Where a source of a signal having a DC component is coupled to a plurality of signal processing sections such as amplifiers, it is usual to remove the DC component of the source signal and feed only the AC component to the individual amplifiers. In such a system, where a plurality of amplifiers are operated, the corresponding number of biasing means are required. In addition, coupling capacitors provided in the individual amplifiers offer varying impedance with different signal frequencies, and therefore constitute a cause of deterioration of the frequency characteristics of the whole circuitry including the amplifiers.

Further, where a plurality of differential amplifiers which are driven in parallel are included, a DC off-set which might result between the base biases impressed upon two transistors that form each differential amplifier would make the input dynamic range gain instable, thus giving rise to the distortion of the output signal. Furthermore, the bias power supplies or bias means required are increased in number with increasing number of differential amplifiers. Particularly, in case of implementing such a circuitry with a semiconductor integrated circuit, fluctuations of the base bias for the individual transistors of the differential amplifiers due to fluctuations of the individual bias values are prone, as well as a great number of IC or LSI chip connection pins have to be provided.

An object of the invention is to provide a signal processing circuit, with which a signal from a signal source can be coupled to individual signal processing sections without agency of any coupling capacitor to preclude otherwise possible deterioration of the frequency characteristics, and also which is free from the aforementioned DC off-set, and hence free from the output signal distortion, in case where a differential amplifier is used as a signal processing section, as well as being simple in circuit construction and capable of implementation with a semiconductor integrated circuit with a reduced number of connection pins.

With the signal processing circuit according to the invention, an AC input signal containing a DC component is coupled through a low-pass filter including a resistor and a capacitor to derive the sole DC component for use as bias voltage. The AC component of signal is directly fed as input to individual signal processing sections such as amplifiers for processing therein.

This invention can be more fully understood from the following detailed description when taken in conjunction with the accompanying drawings, in which.

Figure 1:
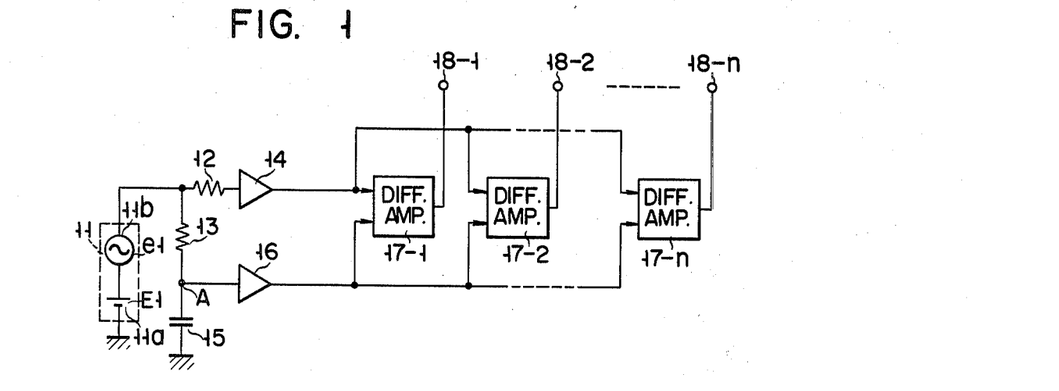
FIG. 1 is a circuit diagram, partly in block form, showing an embodiment of the signal processing circuit according to the invention.

Referring now to FIG. 1, which shows an embodiment of the invention, a signal source 11 provides an AC signal $e_1$ which contains a DC component $E_1$. In the FIGURE, the signal source is shown as a combination of a DC signal source 11a and an AC signal source 11b for facilitating the understanding of the description. The signal source 11 has one terminal grounded and the other terminal connected to the juncture between resistors 12 and 13. The other end of the resistor 12 is connected to the input side of a first buffer circuit 14, and the other end of the resistor 13 is connected to the input side of a second buffer circuit and also connected through a bypass capacitor 15 to a reference potential line, for instance at zero potential. The first and second buffer circuits 14 and 16 each have an emitter follower construction. The resistor 12 is used for compensating for an off-set due to the resistor 13 which form a low-pass filter together with the bypass capacitor 15. If the impedance of the resistor 13 is sufficiently low compared to the input impedance of the buffer circuits 14 and 16, the resistor 13 can be dispensed with.

The output terminal of the buffer circuit 14 is commonly connected to one input terminal of a plurality of differential amplifiers 17-1, 17-2, . . . , 17-n, while the output terminal of the buffer circuit 16 is commonly connected to the other input terminal of these differential amplifiers. The output of the differential amplifiers 17-1, 17-2, . . . , 17-n are coupled to respective output terminals 18-1, 18-2, . . . , 18-n.

Now, the operation of this embodiment will be described. It is assumed that the resistors 12 and 13 offer the same resistance. The DC bias voltage for the differential amplifiers 17-1, 17-2, . . . , 17-n is determined substantially by the magnitude of the DC component $E_1$ of the AC signal $e_1$ provided by the signal source 11. Thus, the AC signal $e_1$ inclusive of the DC component $E_1$ is fed to the aforementioned one input terminal of the differential amplifiers 17-1, 17-2, . . . , 17-n, while the DC component $E_1$ is applied as bias voltage to the other input terminal of these differential amplifiers.

Since the DC component $E_1$ is impressed as base bias upon the two transistors that form each of the differential amplifiers 17-1, 17-2, . . . , 17-n, there is no possibility of generation of a DC off-set between two base biases. This is true even if the DC component $E_1$ varies at a sufficiently low frequency with respect to the cut-off frequency of the low-pass filter consisting of the resistor 13 and the capacitor 15 due to source voltage variations or temperature drifts. At this time, the two base biases vary the same amount, so that there occurs no relative changes of their levels, and no DC off-set results. For this reason, it is possible to obtain steady and stable operation of the signal processing circuit. Particularly, when implementing the circuit of FIG. 1 with a semiconductor integrated circuit, it is necessary to provide only a single connection pin for connecting the bypass capacitor 15 as an external capacitor at point A regardless of the number of differential amplifiers 17-1, 17-2, . . . , 17-n involved. With the prior art circuit, a coupling capacitor is required for each differential amplifier, that is, external capacitor connection pins are required in number corresponding to the number of amplifiers provided. Thus, according to the invention it is possible to greatly reduce the number of connection pins in the implementation with a semiconductor integrated circuit. Further, since in the above embodiment no coupling capacitor is connected between the signal source 11 and signal input terminal of each of the differential amplifiers 17-1, 17-2, ..., 17-n, there is no element that undergoes the impedance change with the frequency of the AC signal $e_1$, that is, there is no element that is a cause of deterioration of the frequency characteristics.

Figure 2:
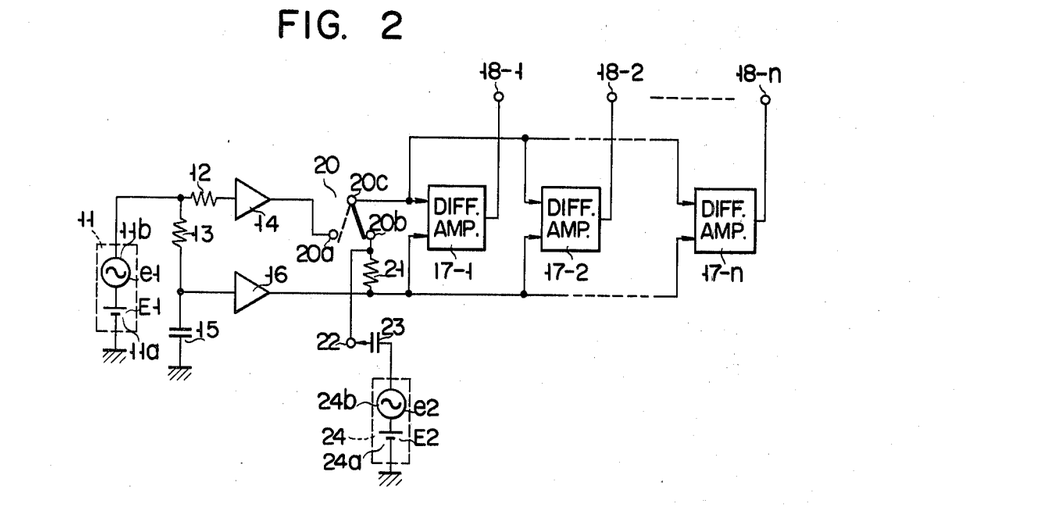
FIG. 2 is a circuit diagram, partly in block form, showing a different embodiment of the invention.

FIG. 2 shows a different embodiment. In FIGS. 1 and 2, like parts are designated by like reference numerals. Referring to FIG. 2, the output of the buffer circuit 14 is led to a fixed terminal 20a of a switch 20. Another fixed terminal 20b of the switch 20 is connected through a load resistor 21 to the output side of the buffer circuit 16. The fixed terminal 20b is also connected to a signal input terminal 22. To this input terminal is fed an AC signal $e_2$ from a signal source 24 through a coupling capacitor 23. The AC signal $e_2$ contains a DC component $E_2$. In the FIGURE, the signal source 24 is shown as a combination of a DC signal source 24a and an AC signal source 24b for facilitating the understanding of the description. The rest of this circuit is the same as in the circuit of FIG. 1.

In operation, when the switch 20 is set to the side of the fixed contact 20a, the circuit of FIG. 2 operates in the same way as the circuit of FIG. 1, so description in this connection is omitted.

When the switch 20 is set to the side of the fixed contact 20b, the AC signal $e_1$ that is provided as the output of the buffer circuit 14 is not applied to the differential amplifiers 17-1, 17-2, ..., 17-n. However, the DC component in the AC signal $e_1$ is extracted through the low-pass filter including the resistor 13 and capacitor 15 and applied as common DC bias to the other input terminal of each of the differential amplifiers 17-1, 17-2, ..., 17-n through the buffer circuit 16.

To the previously mentioned one terminal of each of the differential amplifiers 17-1, 17-2, ..., 17-n is commonly fed the AC signal $e_2$ from the signal source 24 through the coupling capacitor 23. At this time, the DC component $E_2$ contained in the AC signal $e_2$ is removed through the coupling capacitor 23, and only the AC component of signal $e_2$ appears at the input signal terminal 22.

In this case, if the input impedance of each of the differential amplifiers 17-1, 17-2, ..., 17-n is so large compared to the resistance of the resistor 21 that a voltage drop across the resistor 21 is insubstantial, there is no possibility of a differential input DC off-set resulting between the AC component $e_2$ and DC bias $E_1$ by the DC component, and this a signal processing circuit which operates stably and is suited for implementation with a semiconductor integrated circuit can be obtained.

Figure 3:
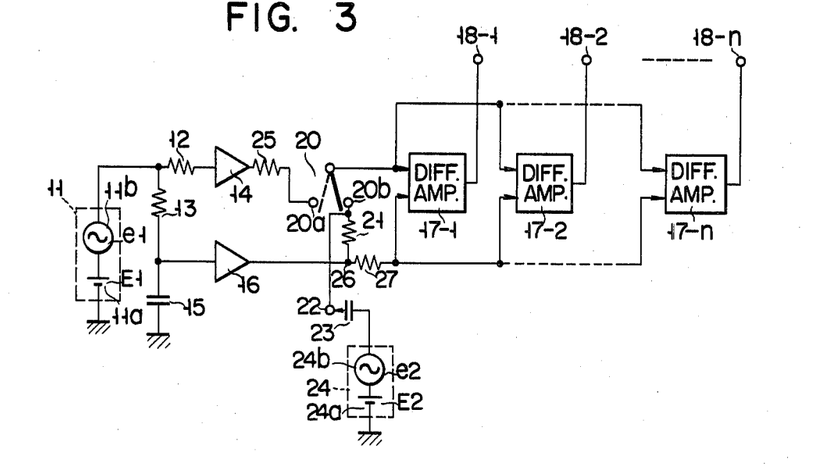
FIG. 3 is a circuit diagram, partly in block form, showing a further embodiment of the invention.

If the input impedance of the differential amplifiers 17-1, 17-2, ..., 17-n can not noticeable in comparison to the resistance of the resistor 21, however, a differential input DC off-set corresponding to the voltage drop across the resistor 21 results. To make up for this voltage drop across the resistor 21, a resistor 27 may be connected between the juncture 26 between the buffer circuit 16 and resistor 21 and the aforementioned other input terminal of each differential amplifier 17-1, 17-2, ..., 17-n, as shown in FIG. 3. Also, a resistor 25 may be connected to the output side of the buffer circuit 14 for compensating for a DC off-set that is produced by the resistor 27 when the switch 20 is set to the side of the fixed contact 20a.

The circuit of FIG. 3 is the same as the circuit of FIG. 2 except for that the resistor 25 is connected between the buffer circuit 14 and fixed contact 20a and that the resistor 27 is connected between the juncture 26 between the buffer circuit 16 and resistor 21 and the aforementioned other input terminal of each differential amplifier 17-1, 17-2, ..., 17-n. In this circuit, if the resistors 12 and 13 have the same resistance and the voltage drops in the buffer circuits 14 and 16 are the same, the DC components of the outputs of the buffer circuits 14 and 16 have the same value $E_3$.

When the switch 20 is set to the side of the fixed contact 20a, the DC voltages $E(+)$ and $E(-)$ of the differential inputs to the two input terminals of each differential amplifier 17-1, 17-2, ..., 17-n are given as $$\left. \begin{array}{l} E(+) = E_3 - IB_1 \times R_{25}, \text{ and} \\ E(-) = E_3 - IB_2 \times R_{27} \end{array} \right\} \quad (1)$$

where $R_{25}$ and $R_{27}$ are respectively the resistances of the resistors 25 and 27, and $IB_1$ and $IB_2$ are the base current sums of the respective groups of transistors in the individual differential amplifiers 17-1, 17-2, ..., 17-n.

When the switch 20 is set to the side of the fixed contact 20b, the DC voltages $E(+)$ and $E(-)$ are $$\left. \begin{array}{l} E(+) = E_3 - IB_1 \times R_{21}, \text{ and} \\ E(-) = E_3 - IB_2 \times R_{27} \end{array} \right\} \quad (2)$$

where $R_{21}$ is the resistance of the resistor 21.

As is seen from equations (1) and (2) mentioned, where the input and output impedances of the switch 20 are sufficiently low compared to the input impedance of the differential amplifiers 17-1, 17-2, ..., 17-n, the resistances of the resistors 21, 25 and 27 may be set equal, i.e., $R_{21} = R_{25} = R_{27}$. If this is done so, there always holds $E(+) = E(-)$ regardless of the state of the switch 20. Where the input impedance of the switch 20 is sufficiently high while the output impedance of the switch is sufficiently low, in addition to setting $E(+) = E(-)$ the resistance of the resistor 27 is set such that $R_{21} = R_{25}$ and, it can compensate for the voltage drop across the resistor 21. Further, in case the DC voltage $E_3$ varies at a low frequency with source voltage variations or temperature changes, the voltages $E(+)$ and $E(-)$ simultaneously vary in the same direction and by the same amount for the DC voltages of value $E_3$ depend upon the same voltage source, that is, their relative changes to each other never results, so that it is possible to obtain a very stable differential amplifier output.

While in the preceding embodiments of FIGS. 2 and 3 the resistor 21 has been used for AC supression, if an inductance element such as a choke coil is used in lieu of the resistor 21, it produces no voltage drop with respect to the DC signal component, which is very convenient.

Figure 4:
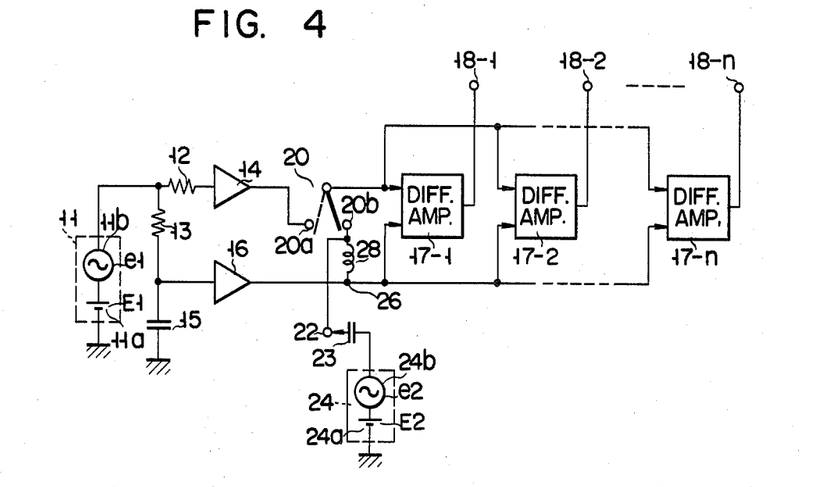
FIG. 4 is a circuit diagram, partly in block form, showing a still further embodiment of the invention.

FIG. 4 shows such an example, in which a choke coil 28 is connected between the fixed contact 20b of the switch 20 and node 26 in lieu of the aforementioned resistor 21. In this case, the resistors 25 and 27 in the embodiment of FIG. 3 are omitted. The rest of the construction is the same as in the circuits of FIGS. 2 and 3. In FIGS. 2, 3 and 4 like parts are designated by like reference numerals.

While in the above embodiments of FIGS. 2 to 4 the AC signal inputs $e_1$ and $e_2$ are coupled through the switch 20 to each differential amplifier, it is possible to permit three or more different AC signals to be selectively coupled through a switch to each differential amplifier. In this case, it is only necessary to increase the number of fixed contacts of the switch 20 to meet the number of different input signals handled. The switch 20 may also be either an electronic switch or a mechanical switch.

Figure 5:
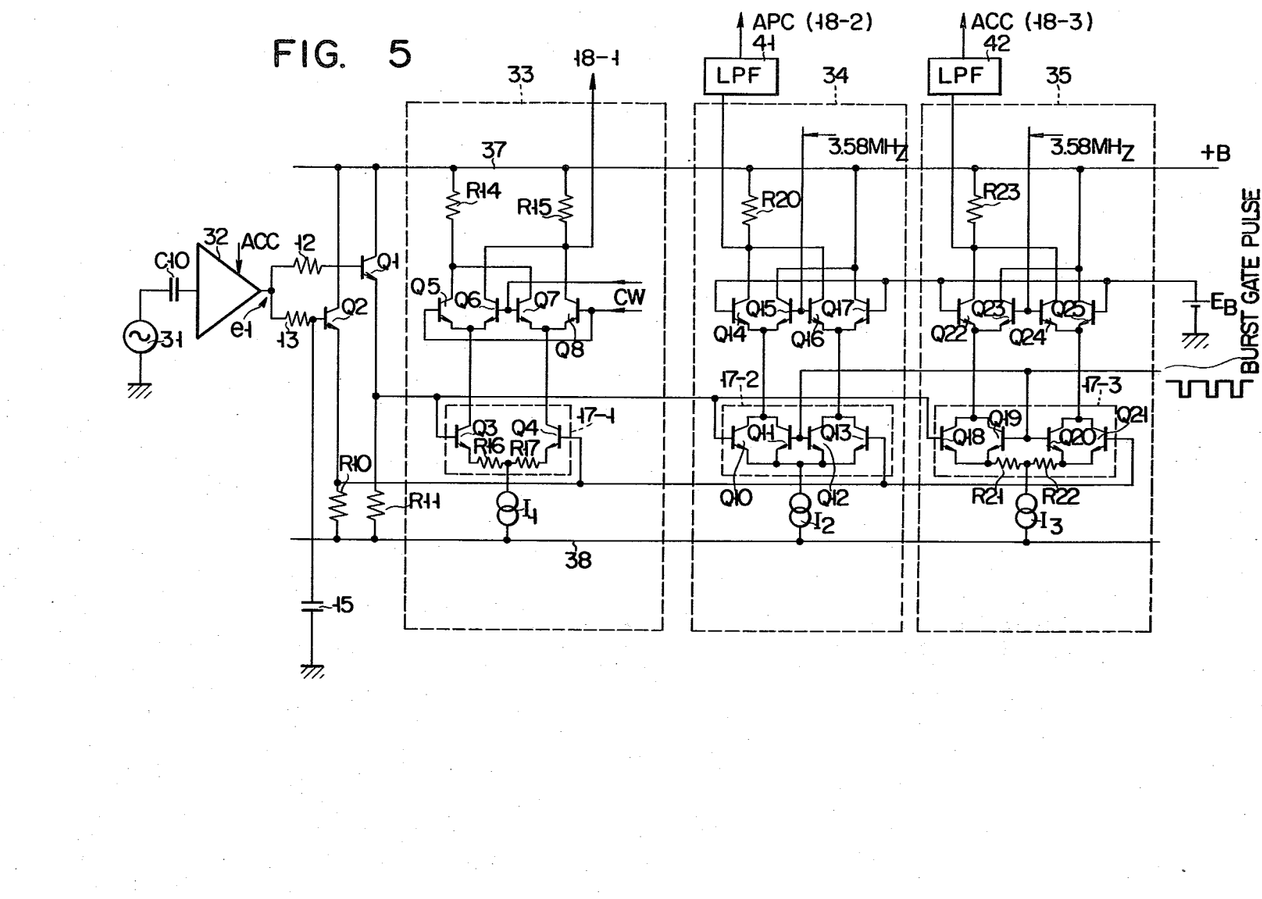
FIG. 5 is a circuit diagram showing a detailed circuit construction of a video tape recorder signal processing circuit embodying the invention.

Now, a specific detailed example of the embodiment of FIG. 1, applied to a color signal processing section of a video tape recorder, will be described with reference to FIG. 5. In FIGS. 1 and 5, like parts are designated by like reference numerals.

Referring to FIG. 5, designated at 31 is a source of color signal (3.58 MHz) for recording, for instance, which is connected through a capacitor $C_{10}$ to an automatic color control amplifier 32. The output of the amplifier 32 is impressed through a resistor 12 upon the base of a transistor $Q_1$ which forms the first buffer circuit 14. It is also fed to the low-pass filter including the resistor 13 and capacitor 15, and its AC component is bypassed therethrough. Its DC component is impressed upon the base of a transistor $Q_2$ which forms the second buffer circuit 16. The transistor $Q_2$ has its collector connected to a power supply line 37 and its emitter connected through a resistor $R_{10}$ to a reference potential line 38. The emitter of this transistor $Q_2$ is also connected to the bias terminal of differential amplifiers 17-1, 17-2 and 17-3, which are in this example included in a frequency converter 33, an automatic phase control detector 34 and an automatic color control detector 35 respectively.

The transistor $Q_1$ mentioned above has its collector connected to the power supply line 37 and its emitter connected through an emitter resistor $R_{11}$ to a reference potential line 38. The emitter of this transistor $Q_1$ is also connected to the signal input terminal or differential input terminal of the differential amplifiers 17-1, 17-2 and 17-3 in the respective frequency converter 33, automatic phase control detector 34 and automatic color control detector 35.

The frequency converter 33 includes a double balanced differential amplifier having transistors $Q_3$ to $Q_8$. It converts the frequency of color signal, which is impressed from the base of the transistor $Q_3$ to the emitter of the transistor $Q_1$, on a carrier CW for frequency conversion supplied to the common base of the transistors $Q_5$ and $Q_8$ and also to that of the transistors $Q_6$ and $Q_7$. Its output appears at the common collector of the transistors $Q_6$ and $Q_8$. Designated at $I_1$ is a constant current source, and at $R_{10}$ to $R_{17}$ resistors.

The automatic phase control detector 34 also includes a differential amplifier having a gate section and a phase detector section. More particularly, the function of phase detection is achieved during a burst signal period of the color signal which is impressed upon the base of a transistor $Q_{10}$. A burst gate pulse signal is supplied to the common base of transistors $Q_{11}$ and $Q_{12}$, and an oscillator output (3.58 MHz) for phase detection is supplied to the common base of transistors $Q_{15}$ and $Q_{16}$. Its phase error output appears at the common collector of transistors $Q_{14}$ and $Q_{16}$ and is fed to a low-pass filter 41. This output of automatic phase control detector 34 represents the phase difference between the burst signal and 3.58 MHz local oscillator output provided in the video tape recorder. Thus, it is utilized as a frequency control signal for the oscillator for obtaining steady and stable color signal processing. In other words, the frequency of the carrier signal CW supplied to the frequency converter 33 is controlled through the control of the oscillator frequency. Designated at $I_2$ is a constant current source, and at $R_{20}$ a resistor. To the base of a transistor $Q_{13}$ is applied the DC bias from the aforementioned low-pass filter formed by the resistor 13 and capacitor 15. A bias voltage from a power supply $E_B$ is applied to the common base of transistors $Q_{14}$ and $Q_{17}$.

The automatic color control detector 35 practically has the pause construction as the aforementioned automatic phase control detector 34. The burst gate pulse signal is supplied to the common base of transistors $Q_{19}$ and $Q_{20}$, and the burst signal extracted from the color signal input to a transistor $Q_{18}$ is detected in a section including transistors $Q_{22}$ to $Q_{25}$. The detector output appears at the common collector of transistors $Q_{22}$ and $Q_{24}$ and is fed to a low-pass filter 42. The output ACC (18-3) of the low-pass filter 42 is fed to a gain control terminal of the aforementioned automatic color control amplifier 32 for stable color signal amplitude control. Designated at $I_3$ is a current source, and at $R_{21}$ to $R_{23}$ are resistors. To the base of a transistor $Q_{21}$ is applied the DC bias from the low-pass filter including the resistor 13 and capacitor 15. To the common base of the transistors $Q_{23}$ and $Q_{24}$ is supplied the 3.58 MHz oscillator output, and to the common base of the transistors $Q_{22}$ and $Q_{25}$ is applied the bias of the power supply $E_B$.

The video tape recorder signal processing circuit described above is used in recording mode, for instance, with the 3.58 MHz color signal for recording coupled to the automatic color control amplifier 32. This input signal is converted in the frequency converter 33 into a 688 kHz low frequency color signal. In order to be able to provide this 688 kHz color signal as steady signal for recording, it is necessary to stabilize the amplitude of the (3.58 MHz) color signal input to the automatic color control amplifier 32. For this reason, the output of the automatic color control detector 35 is fed back through the low-pass filter 42 to the control terminal of the automatic color control amplifier 32.

Further, for stabilizing the aforementioned 688 kHz color signal for recording, it is necessary to provide a steady and stable relation between the carrier frequency for the frequency conversion and 3.58 MHz burst signal frequency. To meet this, the detection voltage output APC (18-2) obtained from the automatic phase control detector 34 is supplied as control signal to the 3.58 MHz voltage controlled oscillator as carrier generator. By so doing, a steady and stable phase relation can also be obtained.

Figure 6:
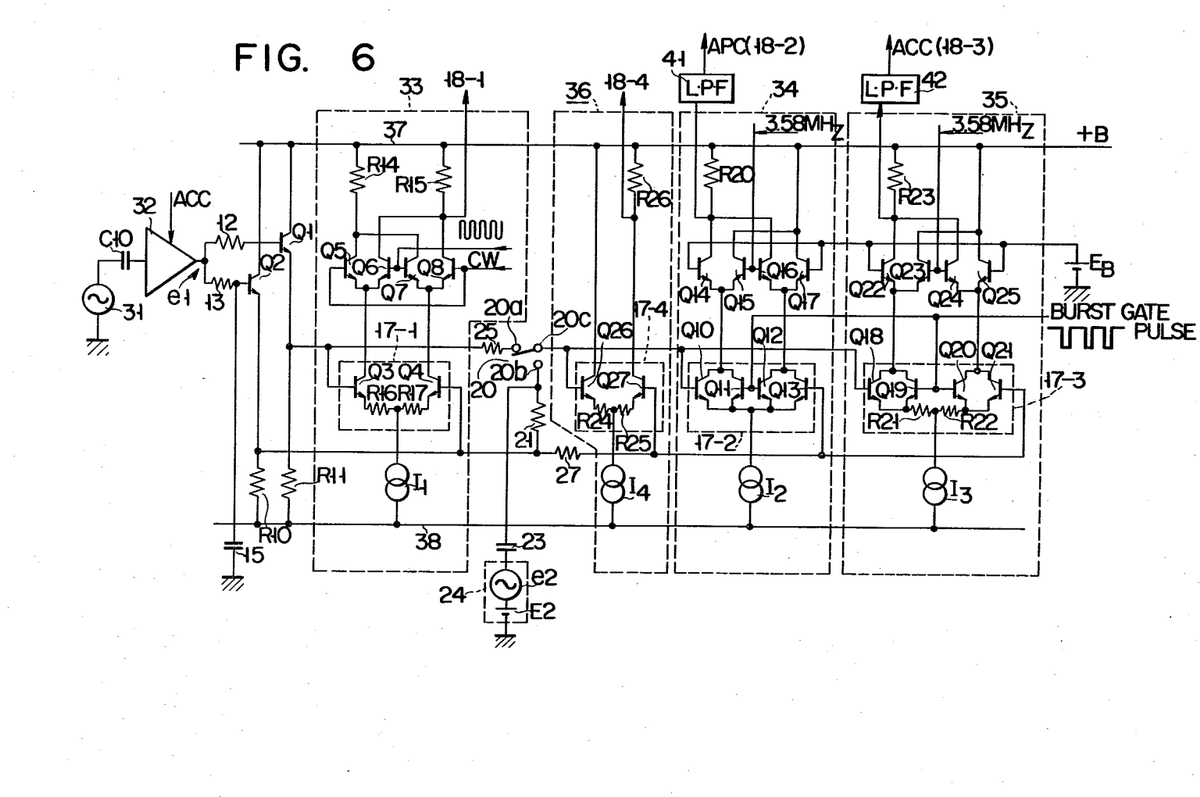
FIG. 6 is a circuit diagram showing a detailed circuit construction of another video tape recorder signal processing circuit embodying the invention.

Now, a specific detailed example of the embodiment of FIG. 3 will be described with reference to FIG. 6. Like parts in FIGS. 3 and 6 are designated by like reference numerals. FIG. 6 shows a reproduced signal and recording signal processing section of a video tape recorder.

Referring to FIG. 6, designated at 31 is a source of signal, which provides a 688 kHz color signal reproduced from magnetic tape in the playback mode and 3.58 MHz recording color signal in the recording mode. The color signal input is coupled through a capacitor $C_{10}$ to an automatic color control amplifier 32 for gain control. The output of the amplifier 32 is impressed through the resistor 12 upon the base of a transistor $Q_1$ which forms the first buffer circuit 14, it is also fed to the low-pass filter including the resistor 13 and capacitor 15, and its AC color signal component is bypassed therethrough. Its DC component is impressed upon the base of a transistor $Q_2$ which forms the second buffer circuit 16.

The transistor $Q_2$ has its collector connected to a power supply 37 and its emitter connected through a resistor $R_{10}$ to a reference potential line 38. The emitter of this transistor $Q_2$ is also connected to the bias terminals of differential amplifiers 17-1, 17-4, 17-2 and 17-3, which are included in a frequency converter 33, a color signal amplifier 36, an automatic phase control detector 34 and an automatic color control detector 35 respectively.

The transistor $Q_1$ mentioned above has its collector connected to the power supply line 37 and its emitter connected through an emitter resistor $R_{11}$ to a reference potential line 38. The emitter of the transistor $Q_1$ is also connected to the signal input terminal of the frequency converter 33 and further connected through the resistor 25 to the first input terminal 20a of the switch 20.

The frequency converter 33 includes a double balanced differential amplifier having transistors $Q_3$ to $Q_8$. It converts the frequency of color signal, which is impressed from the base of the transistor $Q_3$, on a carrier CW for frequency conversion supplied to the common base of the transistors $Q_5$ and $Q_8$ and also to that of the transistors $Q_6$ and $Q_7$. Its output appears at the common collector of the transistors $Q_6$ and $Q_8$. Designated at $I_1$ is a constant current source, and at $R_{14}$ to $R_{17}$ resistors.

The color signal amplifier 36 includes the differential amplifier 17-4 having transistors $Q_{26}$ and $Q_{27}$. It amplifies an AC signal $e_1$ impressed upon the base of the transistor $Q_{26}$, and its output 18-4 appears at the collector of the transistor $Q_{27}$. Designated at $I_4$ is a constant current source, an at $R_{24}$ to $R_{26}$ resistors.

In the automatic phase detector 34, the differential amplifier 17-3 also has a gate section and a phase detector section. More particularly, the color signal is directed to the base of the transistor $Q_{10}$ when the switch 20 is thrown to the side of the terminal 20a, and the function of phase detection is achieved during the burst signal period of the color signal. A burst gate signal is supplied to the common base of transistors $Q_{11}$ and $Q_{12}$, and a 3.58 MHz oscillator output for phase comparison is supplied to the common base of transistors $Q_{15}$ and $Q_{16}$. The phase error output of this automatic phase detector 34 appears at the common collector of transistors $Q_{14}$ and $Q_{16}$ and is fed to a low-pass filter 41. It represents the phase difference between the burst signal and 3.58 MHz local oscillator output provided in the video tape recorder. Thus, it is utilized as a frequency control signal for the oscillator for obtaining steady and stable color signal processing. Designated at $I_2$ is a constant current source, at $R_{20}$ resistor, and at the DC bias from the low-pass filter having the resistor 13 and capacitor 15 is applied to the base of the transistor $Q_{13}$. A bias from a power supply $E_B$ is applied to the common base of transistors $Q_{14}$ and $Q_{17}$.

The automatic color control detector 35 practically has the same construction as the aforementioned automatic phase control detector 34. The burst gate pulse signal is supplied to the common base of transistors $Q_{19}$ and $Q_{20}$, and the burst signal extracted from the color signal input to a transistor $Q_{18}$ is detected in a section including transistors $Q_{22}$ to $Q_{25}$. The detector output ACC signal appears at the common collector of transistors $Q_{22}$ and $Q_{24}$ and is fed to a low-pass filter 42. The output ACC of the low-pass filter 42 is fed to a gain control terminal of the aforementioned automatic color control amplifier 32. Designated at $I_3$ is a constant current source, and at $R_{21}$ to $R_{23}$ resistors. To the base of a transistor $Q_{21}$ is applied the DC bias from the low-pass filter having the resistor 13 and capacitor 15. To the common base of the transistors $Q_{23}$ and $Q_{24}$ is applied the 3.58 MHz oscillator output, and to the common base of the transistors $Q_{22}$ and $Q_{25}$ is applied the bias from the power supply $E_B$.

In the recording mode, for instance, the switch 20 of the video tape recorder signal processing circuit described above is held thrown to the side of the first input terminal 20a. Also, a 3.58 MHz color signal for recording is fed to the automatic color control amplifier 32. This input signal is converted in the frequency converter 33 into a 688 kHz low frequency color signal. For stabilizing this 688 kHz color signal for recording, the amplitude of the (3.58 MHz) color signal input to the automatic color control amplifier 32 has to be made steady and stable. Therefore, the output of the automatic color control detector 35 is fed back through the low-pass filter 42 to the control terminal of the automatic color control amplifier 32.

Further, for stabilizing the 688 kHz color signal for recording, a steady and stable relation between the carrier frequency for the frequency conversion and 3.58 MHz burst signal frequency has to be provided. To this end, the detection voltage output obtained in the automatic phase control detector 34 is supplied as control signal to the 3.58 MHz voltage controlled oscillator as carrier generator. Doing so also permits to obtain a steady and stable phase relation.

In the playback mode of the video tape recorder, the switch 20 is held thrown to the side of the second input terminal 20b. Also, the reproduced 688 kHz color signal is fed to the automatic color control amplifier 32. This input color signal is converted in the frequency converter 33 into a 3.58 MHz color signal which can be displayed on the ordinary color television receiver.

The frequency converted reproduced color signal $e_2$ (3.58 MHz) is fed as a second signal to the capacitor 23 for amplification as the reproduced color signal through the amplifier 36. For providing steady and stable color signal (3.58 MHz), stabilization of the burst signal amplitude is necessary. To this end, detection output is obtained through the automatic color control amplifier 35, and is fed back through the low-pass filter 42 to the control terminal of the automatic color control amplifier 32.

Further, for stabilizing the reproduced color signal (3.58 MHz), stabilization of the frequency relation between the carrier signal CW supplied to the frequency converter 33 and color signal is necessary. Therefore, the burst signal of the reproduced color signal (3.58 MHz) and the output signal of the reference voltage controlled oscillator as carrier generator are compared in phase, and the phase error of the comparison, obtained as DC detection output signal APC, is fed as control signal to the control terminal of the voltage controlled oscillator.

The video tape recorder signal processing circuits described above embodying the invention permit very stable and high quality signal processing operation involving minimum DC off-set when they are implemented with a semiconductor integrated circuit.

Now, the relation of the magnitudes of the input and output impedances of the switch 20 in th embodiment of FIG. 6 to the resistances of the resistors 21, 25 and 27 will be discussed. Where a bilateral analog switch is used as the switch 20, the input and output impedances of the switch 20 are sufficiently low compared to the input impedance of the differential amplifiers 17-2, 17-3 and 17-4, so that the resistances 21, 25 and 27 may set as $$R_{21}=R_{25}=R_{27}$$

like the circuit of FIG. 3.

Figure 7:
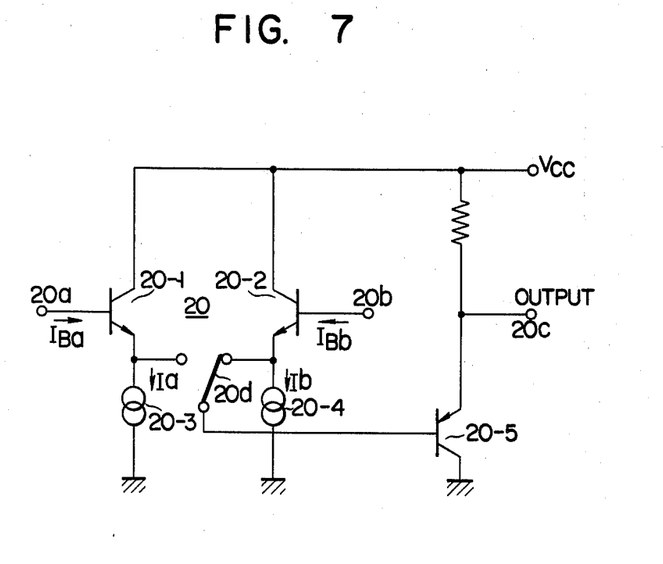
FIG. 7 is a circuit diagram showing a specific example of a switch in the circuit of FIG. 6.

Now, the relation of the resistances 21, 25 and 27 in case where a switch having a high input impedance and a low output impedance such as that shown in FIG. 7 is used as the switch 20 will be discussed. In FIG. 7, terminals 20a, 20b and 20c correspond to the terminals 20a, 20b and 20c of the switch 20 in FIG. 6 respectively. The terminals 20a and 20b are connected to the bases of respective emitter-follower transistors 20-1 and 20-2. The collectors of the transistors 20-1 and 20-2 are commonly connected to a power supply terminal $V_{cc}$, and the emitters of these transistors are grounded through respective constant current sources 20-3 and 20-4 and also connected to respective fixed terminals of a switch element 20d. A movable terminal of the switch element 20d is connected to the base of a transistor 20-5, which has its emitter connected to the output terminal 20c. With this construction of switch 20, where the terminals 20a and 20b are connected through the respective emitter-follower transistors 20-1 and 20-2 to the switch element 20d, the input impedance of its is very high. On the other hand, since the output of the switch 20 is taken out through the transistor 20-5, the output impedance which is determined by the impedance of the transistor 20-5 in the "on" state thereof and is very low. Now, the voltage drops across the resistors 21, 25 and 27 which are connected to the switch 20 of the above construction will be considered. As shown in FIG. 7, the base current in the transistor 20-1 is denoted by $I_{Ba}$, the base current in the transistor 20-2 by $I_{Bb}$, the currents in the constant current sources 20-3 and 20-4 respectively by $I_a$ and $I_b$, and the current amplification factor of the transistors 20-1 and 20-2 by $h_{fe}$.

The voltage drop $\Delta E_{R25}$ across the resistor 25 connected to the terminal 20a is then $$\Delta E_{R25} = \frac{1}{1 + h_{fe}} I_a \times R_{25} \quad (3)$$

Since $h_{fe} >> 1$, $$\Delta E_{R25} = \frac{1}{h_{fe}} I_a \times R_{25} \quad (4)$$

Likewise, the voltage drop $\Delta E_{R21}$ across the resistor 21 connected to the terminal 20b is $$\Delta E_{R21} \approx \frac{1}{2h_{fe}} (I_4 + I_2 + I_3) \cdot R_{21} \quad (5)$$

The current through the resistor 27 is one half the sum of the currents flowing from the constant current sources $I_4$, $I_2$ and $I_3$ in FIG. 6 into the bases of the respective transistors $Q_{27}$, $Q_{13}$ and $Q_{21}$. This is because the currents from the current sources $I_4$, $I_2$ and $I_3$ are divided into halves by the transistors $Q_{26}$ and $Q_{27}$, transistors $Q_{10}$ and $Q_{13}$ and transistors $Q_{18}$ and $Q_{21}$ respectively. Thus, the voltage drop $\Delta E_{R27}$ across the resistor 27 is $$\Delta E_{R27} \approx \frac{1}{2h_{fe}} (I_4 + I_2 + I_3) \cdot R_{27} \quad (6)$$

where $h_{fe} >> 1$. It will thus be seen that in order for the DC off-set of the differential inputs to the differential amplifiers 17-4, 17-2 and 17-3 to be eliminated, the individual voltage drops may be made equal, that is, $$\Delta E_{R25} = \Delta E_{R21} = \Delta E_{R27} \quad (7)$$

In other words, the resistances of the resistors 21, 25 and 27 may be selected such as to satisfy equation (7).

What we claim is:

1. A signal processing circuit comprising:
  at least one differential amplifier having first and second input terminals;
  means for providing a first signal including a DC component to said first input terminal;
  a low-pass filter connected to said first signal providing means for extracting said DC component from said first signal, said filter including a first resistor and a capacitor connected in series between said first input terminal and a reference potential source;
  means for providing a DC bias to said second input terminal, said bias means including a compensation resistor for compensating for the voltage drop across said first resistor;
  a select switch connected between said compensation resistor and said first input terminal and having a first fixed terminal connected to one end of said compensation resistor, a movable terminal and a second fixed terminal for receiving a second signal; and
  a second resistor of a high resistance value connected between said second fixed terminal and said second input terminal.

2. A signal pocessing circuit according to claim 1 further including first and second buffer circuits respectively connected between said compensation resistor and said first fixed terminal and between said low-pass filter and said second input terminal.

3. A signal processing circuit according to claim 2, further including a second compensation resistor connected between said first buffer circuit and said first fixed terminal and a third compensation resistor connected between one end of said first resistor and said first input terminal.

4. A signal processing circuit according to claim 3, wherein the resistances of said resistors are selected to be substantially equal.

5. A signal processing circuit according to claim 3, wherein the resistances of said resistors are set such that the voltage drops across said respective resistors produced by currents therethrough are substantially equal if said select switch has a high input impedance and a low output impedance.

6. A signal processing circuit comprising:
  a plurality of differential amplifiers each having first and second input terminals;
  means for providing a first signal including a DC component to said first input terminals; and
  means for providing a DC bias to said second input terminals, said DC bias means comprising:

low pass filter means, connected to said first signal providing means, for extracting said DC component from said first signal and providing it at an output terminal thereof; and means, coupled to said low pass filter means output terminal, for directing said extracted DC component as a DC bias to said second input terminals of said differential amplifiers;

said low pass filter means including a first resistor and a capacitor connected in series between said first input terminal and a reference potential terminal, and said signal providing means comprising a compensation resistor for compensating for the voltage drop across said first resistor;

said circuit further including a select switch connected between said compensation resistor and said first input terminal and having a first fixed terminal connected to one end of said compensation resistor, a movable terminal connected to said first input terminal and a second fixed terminal for receiving a second signal, and a reactance element of a high impedance connected between said second fixed terminal and said second input terminal.

* * * * *